(12) United States Patent
Cheng et al.

(10) Patent No.: US 9,929,128 B1
(45) Date of Patent: Mar. 27, 2018

(54) CHIP PACKAGE STRUCTURE WITH ADHESIVE LAYER

(71) Applicant: Taiwan Semiconductor Manufacturing Co., Ltd., Hsinchu (TW)

(72) Inventors: Li-Hui Cheng, New Taipei (TW); Po-Hao Tsai, Taoyuan (TW); Jing-Cheng Lin, Hsinchu (TW); Yi-Hang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/492,617

(22) Filed: Apr. 20, 2017

(51) Int. Cl.
*H01L 23/48* (2006.01)
*H01L 25/10* (2006.01)
(Continued)

(52) U.S. Cl.
CPC .......... *H01L 25/105* (2013.01); *H01L 21/565* (2013.01); *H01L 21/6835* (2013.01); *H01L 24/32* (2013.01); *H01L 24/97* (2013.01); *H01L 25/0657* (2013.01); *H01L 25/50* (2013.01); *H01L 21/486* (2013.01); *H01L 21/4853* (2013.01); *H01L 21/4857* (2013.01); *H01L 2221/68345* (2013.01); *H01L 2221/68359* (2013.01); *H01L 2224/16227* (2013.01); *H01L 2224/2919* (2013.01);
(Continued)

(58) Field of Classification Search
CPC ... H01L 25/105; H01L 25/0657; H01L 25/50; H01L 21/565; H01L 21/6835; H01L 21/4853; H01L 21/4857; H01L 21/486; H01L 24/32; H01L 24/97; H01L 2221/68345; H01L 2221/68359; H01L 2224/16227; H01L 2224/2919; H01L 2224/32145; H01L 2224/32225; H01L 2224/48091; H01L 2224/48106; H01L 2224/48227; H01L 2224/48235; H01L 2224/73204; H01L 2225/0651; H01L 2225/06548; H01L 2225/06586; H01L 2225/1023; H01L 2225/1058
USPC ........................................................ 257/737
See application file for complete search history.

(56) References Cited

U.S. PATENT DOCUMENTS 8,802,504 B1   8/2014   Hou et al.
8,803,292 B2   8/2014   Chen et al.
(Continued)

*Primary Examiner* — Tu-Tu Ho
(74) *Attorney, Agent, or Firm* — Birch, Stewart, Kolasch & Birch, LLP

(57) ABSTRACT

A chip package structure is provided. The chip package structure includes a redistribution structure. The chip package structure includes a first chip over the redistribution structure. The first chip has a front surface and a back surface opposite to the front surface, and the front surface faces the redistribution structure. The chip package structure includes an adhesive layer on the back surface. The adhesive layer is in direct contact with the back surface, and a first maximum length of the adhesive layer is less than a second maximum length of the first chip. The chip package structure includes a molding compound layer over the redistribution structure and surrounding the first chip and the adhesive layer. A first top surface of the adhesive layer is substantially coplanar with a second top surface of the molding compound layer.

20 Claims, 19 Drawing Sheets

(51) Int. Cl.
  *H01L 23/00* (2006.01)
  *H01L 25/065* (2006.01)
  *H01L 25/00* (2006.01)
  *H01L 21/683* (2006.01)
  *H01L 21/56* (2006.01)
  *H01L 21/48* (2006.01)

(52) U.S. Cl.
  CPC ............... *H01L 2224/32145* (2013.01); *H01L 2224/32225* (2013.01); *H01L 2224/48091* (2013.01); *H01L 2224/48106* (2013.01); *H01L 2224/48227* (2013.01); *H01L 2224/48235* (2013.01); *H01L 2224/73204* (2013.01); *H01L 2225/0651* (2013.01); *H01L 2225/06548* (2013.01); *H01L 2225/06586* (2013.01); *H01L 2225/1023* (2013.01); *H01L 2225/1058* (2013.01); *H01L 2924/0105* (2013.01); *H01L 2924/14* (2013.01)

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,053,968 B2 * | 6/2015 | Chou | ..................... H01L 23/13 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |

* cited by examiner

CHIP PACKAGE STRUCTURE WITH ADHESIVE LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform and yield of the ICs continues to become easier to be affected by processes. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a bottom view of the adhesive layer and the chip, in accordance with some embodiments.

DETAILED DESCRIPTION

Figure 1A:
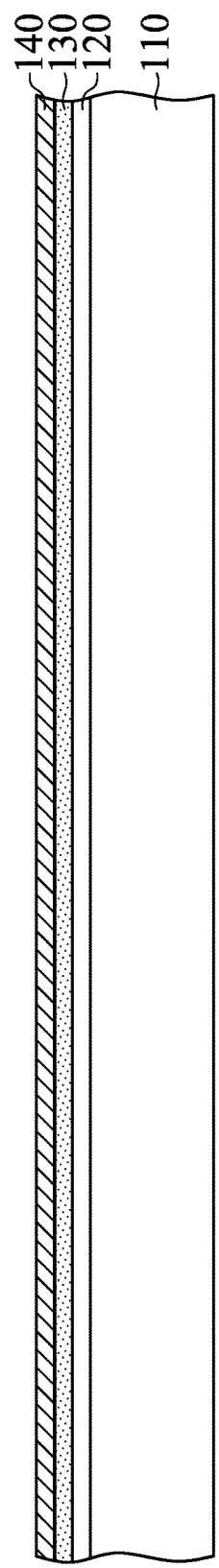
FIGS. 1A-1M are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1M are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 includes any suitable adhesive material, such as an ultraviolet (UV) glue or a Light-to-Heat Conversion (LTHC) glue, which loses its adhesive properties when exposed to a UV light or laser, in accordance with some embodiments. The adhesive layer 120 is formed using a lamination process, a spin coating process, a printing process, or any other suitable process.

As shown in FIG. 1A, a buffer layer 130 is formed over the adhesive layer 120, in accordance with some embodiments. The buffer layer 130 is configured to provide structural support for bonding and facilitate in reducing die shift during subsequent processes, in accordance with some embodiments. The buffer layer 130 includes a polymer material, such as polybenzoxazole (PBO), polyimide, or epoxy, in accordance with some embodiments. The buffer layer 130 is formed using a spin coating process, a chemical vapor deposition process, a laminating process, or a printing process, in accordance with some embodiments.

As shown in FIG. 1A, a conductive layer 140 may be formed over the buffer layer 130, in accordance with some embodiments. The conductive layer 140 includes copper, titanium, combinations thereof, or any other suitable conductive material. The conductive layer 140 is formed using a physical vapor deposition process or a chemical vapor deposition process, in accordance with some embodiments.

Figure 1B:
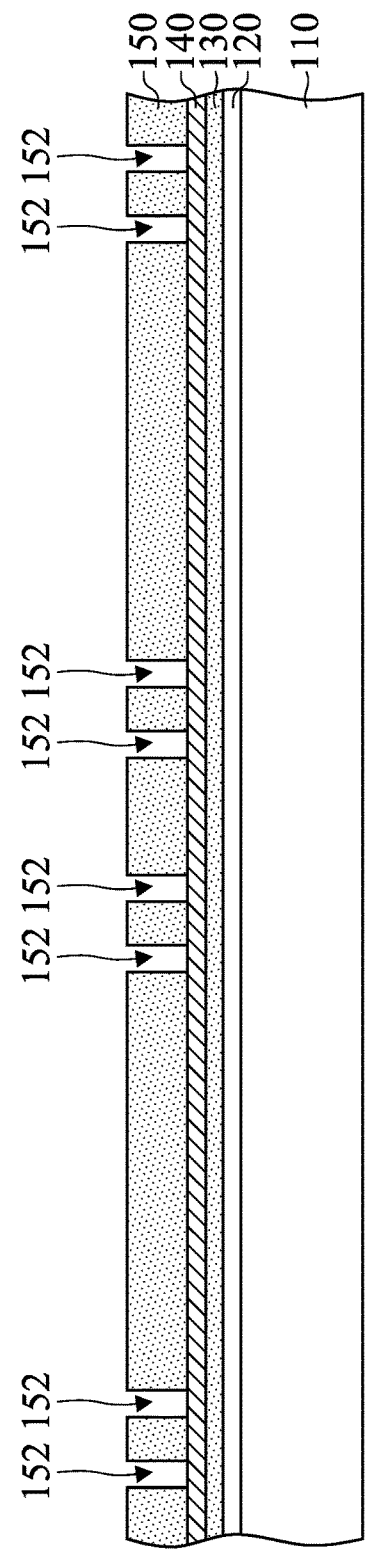

As shown in FIG. 1B, a mask layer 150 is formed over the conductive layer 140, in accordance with some embodiments. The mask layer 150 has through holes 152 exposing portions of the conductive layer 140, in accordance with some embodiments. The mask layer 150 may include a photoresist material or any other suitable material.

The photoresist material includes a polymer material such as polyimide, epoxy, a mixture including poly ethylene, poly methyl methacrylate (PMMA), poly glycidol methacrylate (PGMA), propylene glycol monoethyl ether acetate, ethylene glycol monoethyl ether acetate, cyclized 1,4-cis polyisoprene, novolak resin, metacrylate resin, cresol formaldehyde resin, ethyl lactate, and ethyl 3-ethoxypropionate.

Figure 1C:
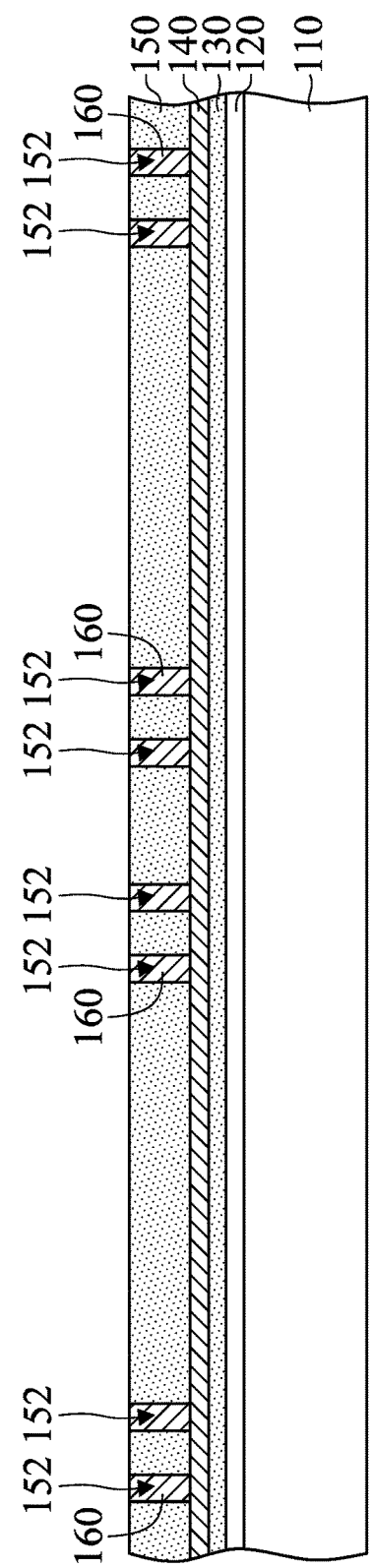

As shown in FIG. 1C, conductive via structures 160 are formed in the through holes 152, in accordance with some embodiments. The conductive via structures 160 are also referred to as conductive structures, in accordance with some embodiments. The conductive via structures 160 may include copper or any other suitable conductive material.

The formation of the conductive via structures 160 includes performing an electroplating process, in accordance with some embodiments. In some other embodiments where the conductive layer 140 is not formed, the formation of the conductive via structures 160 includes performing a deposition process and a planarization process.

Figure 1D:
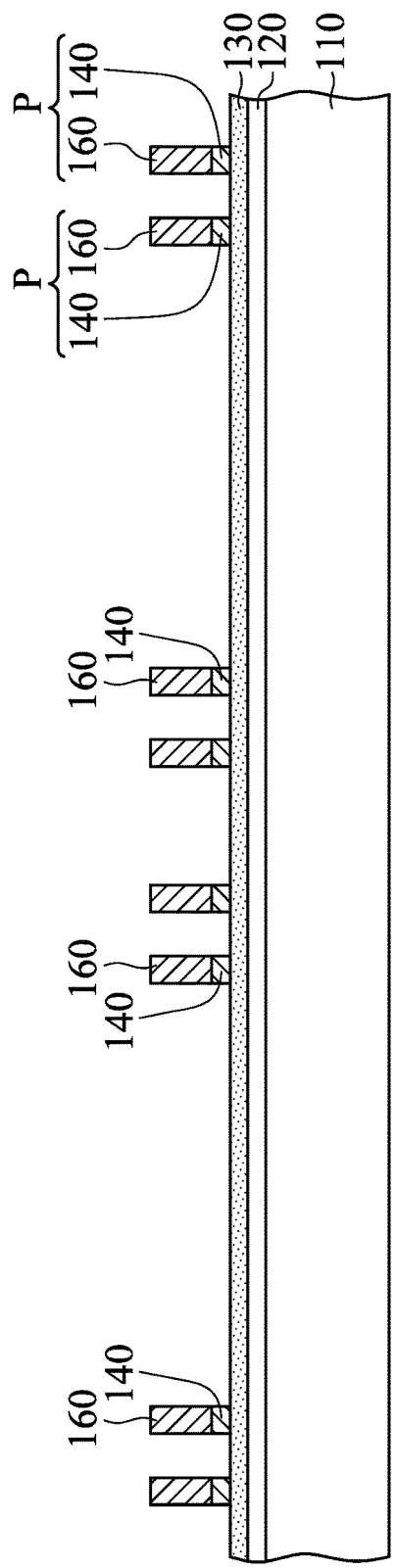

As shown in FIG. 1D, the mask layer 150 is removed, in accordance with some embodiments. The mask layer 150 is removed by dipping the mask layer 150 in a chemical solution, in accordance with some embodiments. The chemical solution includes, for example, ethyl lactate, anisole, methyl butyl acetate, amyl acetate, cresol novolak resin, and/or diazo photoactive compound.

As shown in FIG. 1D, portions of the conductive layer 140, which are not covered by the conductive via structures 160, are removed in accordance with some embodiments. After the removal process, the conductive via structures 160 and the conductive layer 140 remaining thereunder constitute conductive pillars P, in accordance with some embodiments. The removal process includes a wet etching process and/or a dry etching process, in accordance with some embodiments.

Figure 1E:
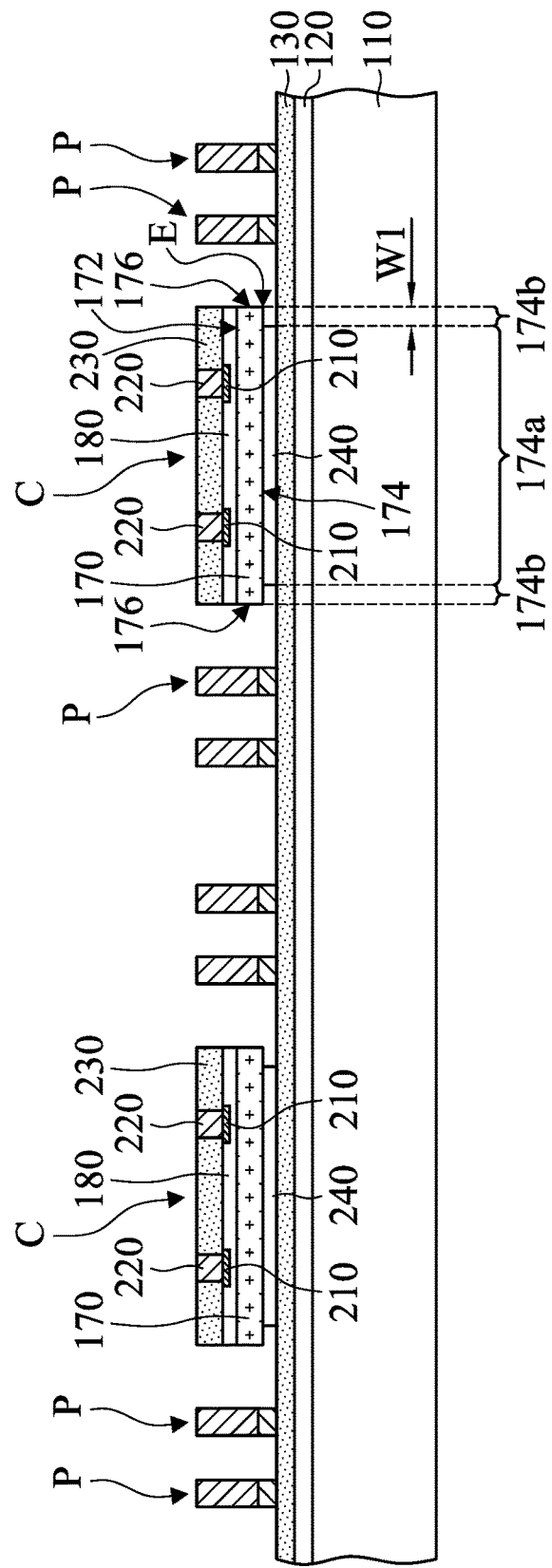

As shown in FIG. 1E, chip structures C are disposed over the buffer layer 130, in accordance with some embodiments. Each of the chip structures C includes a chip 170, a dielectric layer 180, bonding pads 210, interconnection structures 220, and a dielectric layer 230, in accordance with some embodiments.

As shown in FIG. 1E, the chip 170 is disposed over the buffer layer 130, in accordance with some embodiments. The chip 170 is also referred to as a semiconductor substrate, a system-on-chip (SoC), a logic die, or a memory die, in accordance with some embodiments. In some embodiments, the chip 170 is made of at least a semiconductor material, such as silicon or any other suitable semiconductor material.

The chip 170 has a front surface 172 and a back surface 174 opposite to the front surface 172, in accordance with some embodiments. In some embodiments, active elements (e.g., transistors, diodes, or the like) and/or passive elements (e.g., resistors, capacitors, inductors, or the like) are formed on the front surface 172 or in the chip 170 adjacent to the front surface 172.

In some embodiments, active elements (e.g., transistors, diodes, or the like) and passive elements (e.g., resistors, capacitors, inductors, or the like) are not formed on the back surface 174 or in the chip 170 adjacent to the back surface 174. That is, there is no active element and no passive element formed directly on the back surface 174 or in the chip 170 adjacent to the back surface 174. The chip 170 has sidewalls 176 between the front surface 172 and the back surface 174, in accordance with some embodiments. There is an edge E between the back surface 174 and the sidewalls 176, in accordance with some embodiments.

As shown in FIG. 1E, in each of the chip structures C, the dielectric layer 180 is formed over the chip 170, in accordance with some embodiments. The bonding pads 210 are formed in the dielectric layer 180, in accordance with some embodiments. The bonding pads 210 are electrically connected to devices (not shown) formed over the front surface 172 of the chip 170 or in the chip 170 adjacent to the front surface 172, in accordance with some embodiments.

As shown in FIG. 1E, interconnection structures 220 are formed over the respective bonding pads 210, in accordance with some embodiments. The interconnection structures 220 include conductive pillars or conductive bumps, in accordance with some embodiments. As shown in FIG. 1E, a dielectric layer 230 is formed over the dielectric layer 180 and surrounds the interconnection structures 220, in accordance with some embodiments.

As shown in FIG. 1E, an adhesive layer 240 is positioned between the buffer layer 130 and the chip 170 to bond the chip 170 to the buffer layer 130, in accordance with some embodiments. The adhesive layer 240 may be in direct contact with the back surface 174 and the buffer layer 130, in accordance with some embodiments. The adhesive layer 240 is made of an insulating material, such as a polymer material, in accordance with some embodiments.

Figures 1, 1E:
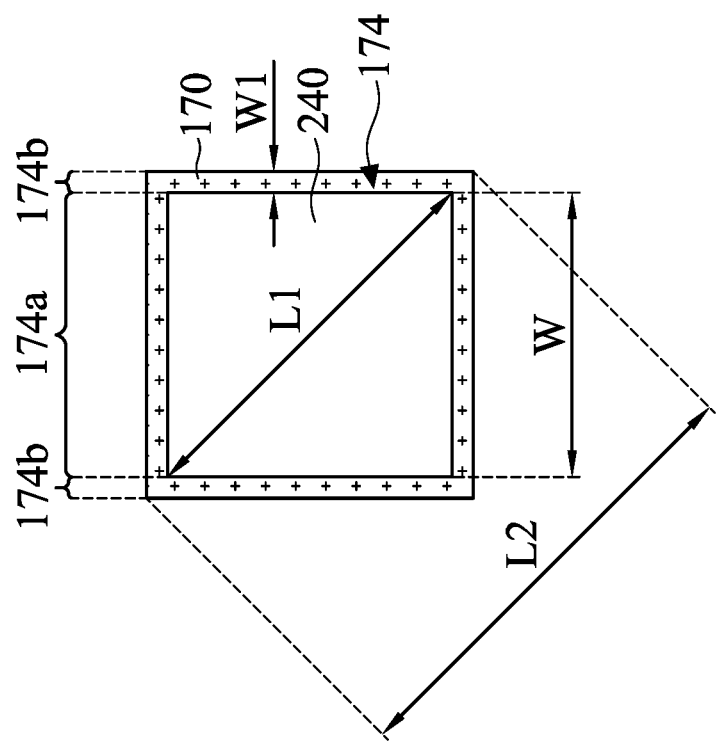

FIG. 1E-1 is a bottom view of the adhesive layer 240 and the chip 170, in accordance with some embodiments. As shown in FIGS. 1E and 1E-1, a maximum length L1 of the adhesive layer 240 is less than a maximum length L2 of the chip 170, in accordance with some embodiments.

The back surface 174 has a central region 174a and a peripheral region 174b, in accordance with some embodiments. The peripheral region 174b continuously surrounds the entire central region 174a, in accordance with some embodiments. In some embodiments, a width W1 of the peripheral region 174b ranges from about 0.5μm to about 15 μm. In some embodiments, the width W1 is less than a width W of the adhesive layer 240.

In some embodiments, the adhesive layer 240 covers the entire central region 174a and does not cover the peripheral region 174b and the edge E of the chip 170. The peripheral region 174b surrounds the entire adhesive layer 240, in accordance with some embodiments. In some embodiments, bubbles tend to be formed in an adhesive layer close to or covering an edge of a chip. Since the adhesive layer 240 does not cover the peripheral region 174b and the edge E, the formation of bubbles in the adhesive layer 240 may be prevented or reduced, in accordance with some embodiments.

Figure 1F:
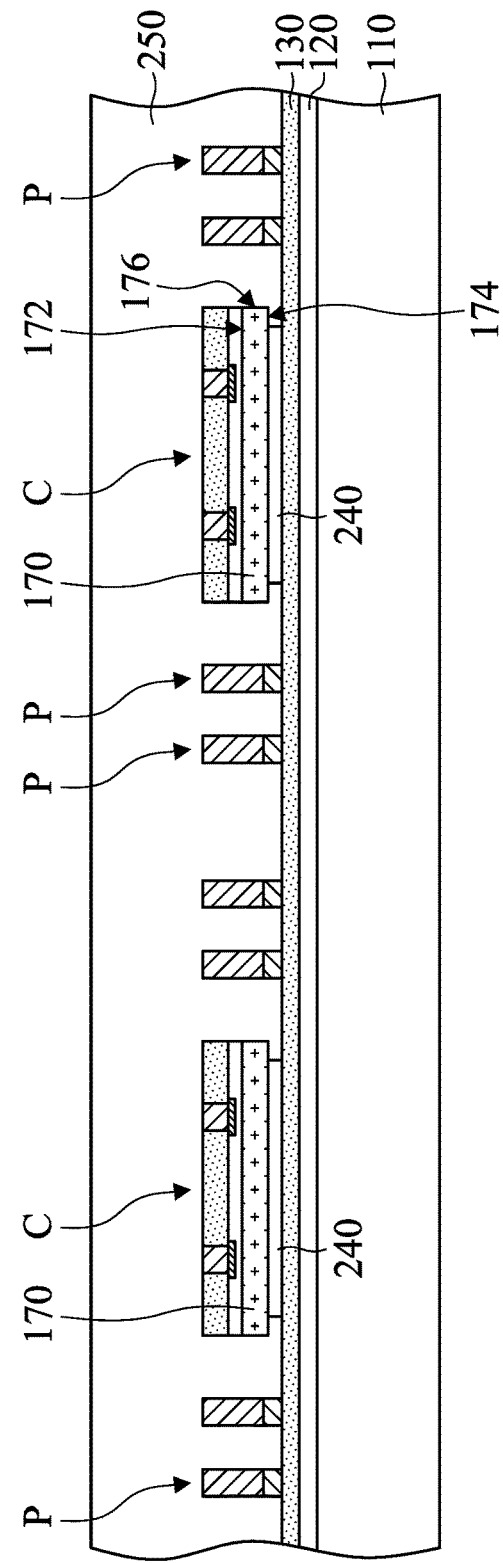

As shown in FIG. 1F, a molding compound layer 250 is formed over the buffer layer 130 to cover the conductive pillars P, the chip structures C, and the adhesive layer 240, in accordance with some embodiments. The molding compound layer 250 is in direct contact with a portion of the back surface 174, the sidewalls 176, the adhesive layer 240, the buffer layer 130, and the conductive pillars P, in accordance with some embodiments.

In some embodiments, the molding compound layer 250 is not in direct contact with the front surface 172. The molding compound layer 250 includes a polymer material, in accordance with some embodiments. The molding compound layer 250 and the adhesive layer 240 are made of different materials, in accordance with some embodiments. The molding compound layer 250 is formed using a molding process, in accordance with some embodiments.

Figure 1G:
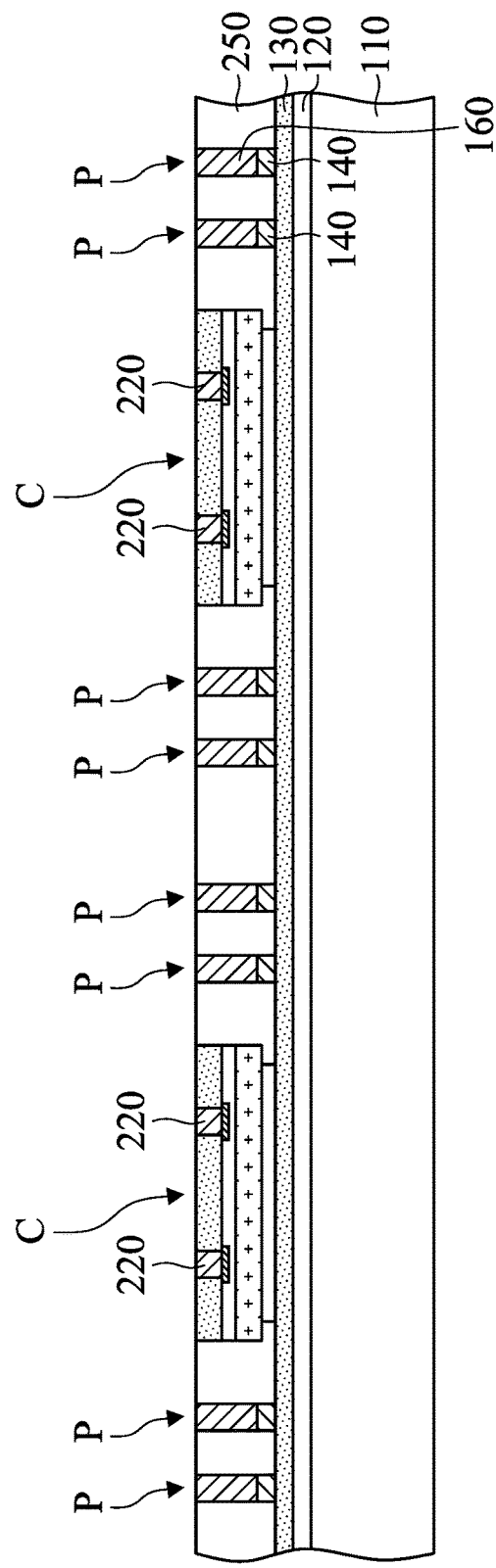

As shown in FIG. 1G, a top portion of the molding compound layer 250 is removed to expose the interconnection structures 220 of the chip structures C and the conductive pillars P, in accordance with some embodiments. The removal process includes a chemical mechanical polishing process, in accordance with some embodiments. Furthermore, after the removal process, the molding compound layer 250 surrounds the chip structures C, the conductive layer 140, and the conductive via structures 160, in accordance with some embodiments.

Figure 1H:
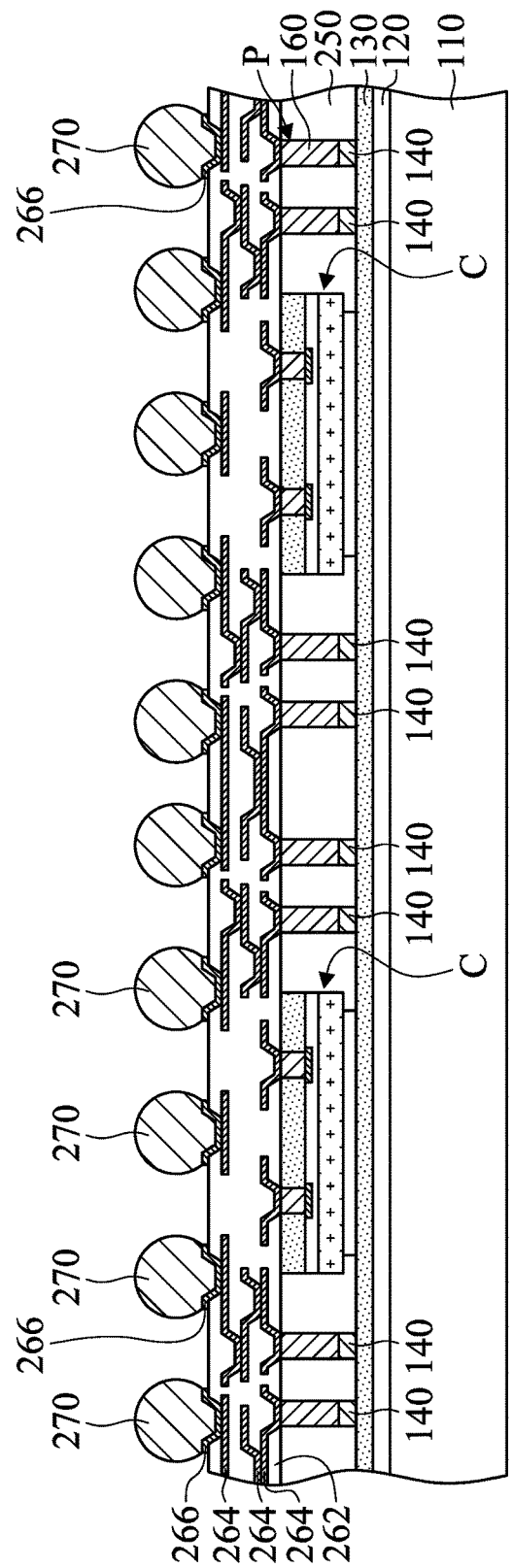

As shown in FIG. 1H, a redistribution structure 260 is formed over the chip structures C, the molding compound layer 250, and the conductive pillars P, in accordance with some embodiments. The redistribution structure 260 includes a dielectric layer 262, wiring layers 264, and pads 266, in accordance with some embodiments. The dielectric layer 262 is over the chip structures C, the molding compound layer 250, and the conductive pillars P, in accordance with some embodiments.

The wiring layers 264 are formed in the dielectric layer 262, in accordance with some embodiments. The pads 266 are formed over the dielectric layer 262 and electrically connected to the wiring layers 264, in accordance with some embodiments. As shown in FIG. 1H, conductive bumps 270 are formed over the pads 266, in accordance with some embodiments. The conductive bumps 270 include tin (Sn) or any other suitable material, in accordance with some embodiments. The formation of the conductive bumps 270 includes forming a solder paste over the pads 266 and reflowing the solder paste, in accordance with some embodiments.

Figure 1I:
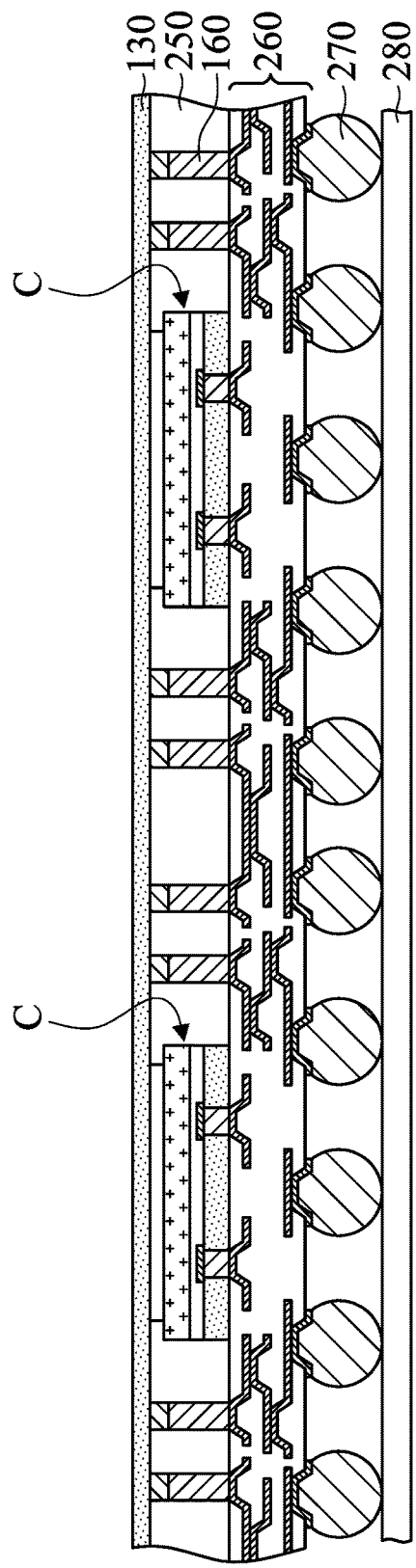

As shown in FIG. 1I, the chip structures C are flipped upside down and disposed over a frame 280 (or a carrier), in accordance with some embodiments. As shown in FIG. 1I, the carrier substrate 110 and the adhesive layer 120 are subsequently removed, in accordance with some embodiments.

Figure 1J:
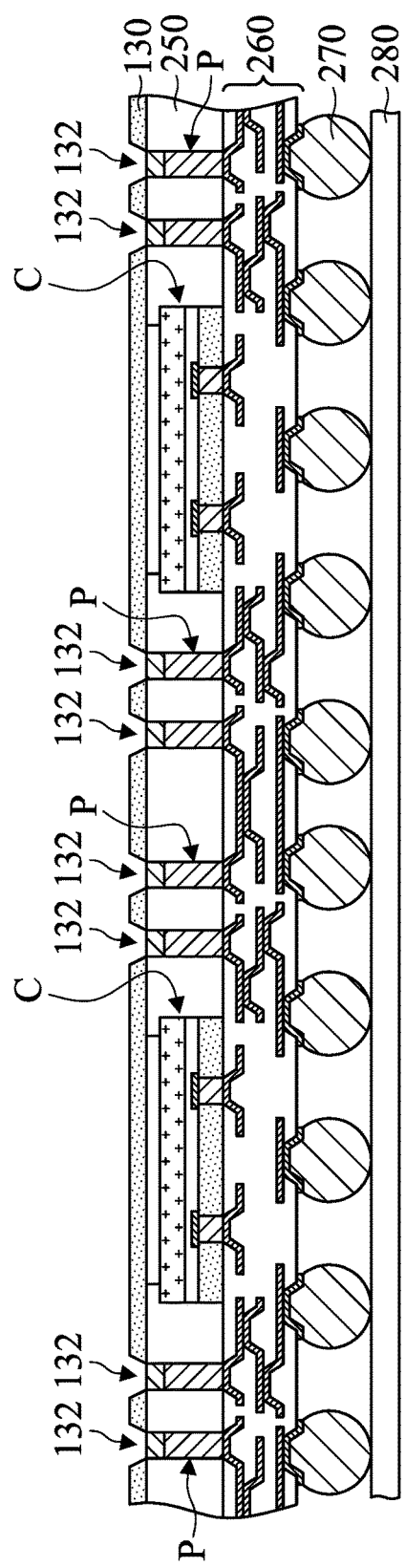

As shown in FIG. 1J, portions of the buffer layer 130 are removed to form openings 132 in the buffer layer 130, in accordance with some embodiments. The openings 132 correspondingly expose the conductive pillars P, in accordance with some embodiments. The removal process may be a photolithography process, a laser debonding process, or an etching process, in accordance with some embodiments. In some other embodiments, the buffer layer 130 is completely removed to expose the conductive pillars P.

Figure 1K:
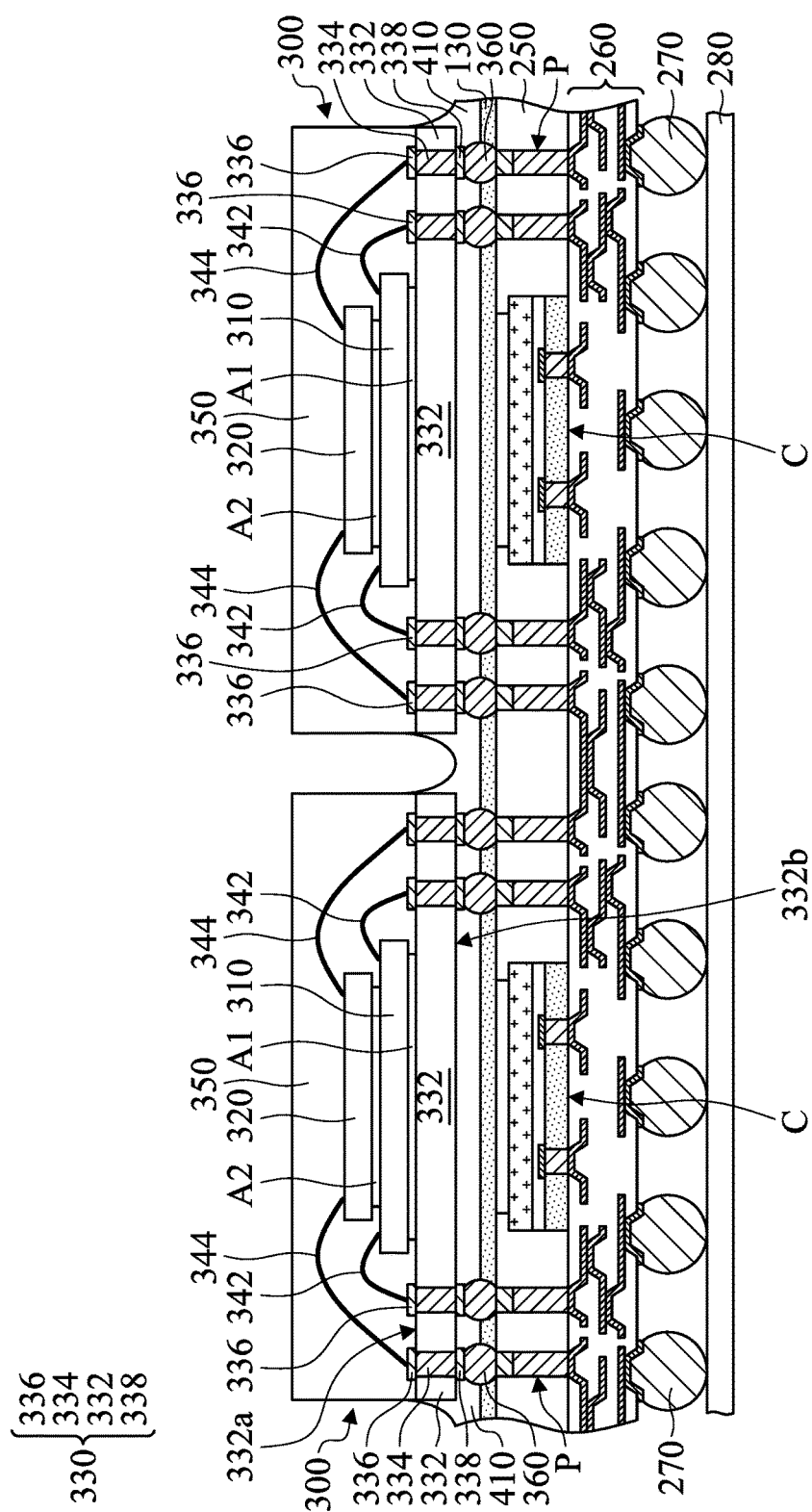

As shown in FIG. 1K, chip packages 300 are correspondingly disposed over the chip structures C and the molding compound layer 250 to bond with the conductive pillars P, in accordance with some embodiments. Each of the chip packages 300 includes chips 310 and 320, a substrate 330, conductive wires 342 and 344, a molding compound layer 350, conductive bumps 360, in accordance with some embodiments.

The chips 310 and 320 are disposed over the substrate 330, in accordance with some embodiments. The chip 310 is bonded to the substrate 330 through an adhesive layer A1 disposed therebetween, in accordance with some embodiments. In some embodiments, a maximum length of the adhesive layer A1 is less than a maximum length of the chip 310.

The chip 320 is bonded to the chip 310 through an adhesive layer A2 disposed therebetween, in accordance with some embodiments. In some embodiments, a maximum length of the adhesive layer A2 is less than a maximum length of the chip 320.

The substrate 330 includes a dielectric layer 332, conductive via structures 334, and bonding pads 336 and 338, in accordance with some embodiments. The dielectric layer 332 may have dielectric films (not shown) stacked one upon another. The dielectric layer 332 has opposite surfaces 332a and 332b, in accordance with some embodiments. The conductive via structures 334 pass through the dielectric layer 332, in accordance with some embodiments.

The bonding pads 336 are positioned over the surface 332a, in accordance with some embodiments. The bonding pads 336 are positioned over the respective conductive via structures 334 to electrically connect to the respective conductive via structures 334, in accordance with some embodiments.

The bonding pads 338 are positioned over the surface 332b, in accordance with some embodiments. The bonding pads 338 are positioned under the respective conductive via structures 334 to electrically connect to the respective conductive via structures 334, in accordance with some embodiments.

The conductive wires 342 physically and electrically connect the chip 310 to the bonding pads 336, in accordance with some embodiments. The conductive wires 344 physically and electrically connect the chip 320 to the bonding pads 336, in accordance with some embodiments. The molding compound layer 350 is molded over the chips 310 and 320, the conductive wires 342 and 344, and the substrate 330, in accordance with some embodiments.

The molding compound layer 350 is configured to protect the chips 310 and 320 and the conductive wires 342 and 344 from damage and contamination during subsequent processes, in accordance with some embodiments. In some embodiments, a portion of the molding compound layer 350 is between the chip 310 and the dielectric layer 332. In some embodiments, a portion of the molding compound layer 350 is between the chips 310 and 320. The molding compound layer 350 includes a polymer material, in accordance with some embodiments.

The chip package 300 shown in FIG. 1K is an example. The chip package 300 is not limited to the type of the chip package 300 shown in FIG. 1K. That is, the chip packages 300 may be any suitable type of chip package. For example, the chip package 300 includes a package-on-package (PoP) type semiconductor package, a multi-chip stacked package, a chip package including chips stacked on a substrate, a chip package including only one chip, or any other suitable type of chip package.

The conductive bumps 360 connect the bonding pads 338 to the conductive pillars P, in accordance with some embodiments. The conductive bumps 360 pass through the buffer layer 130, in accordance with some embodiments. The conductive bumps 360 are between the substrate 330 and the molding compound layer 250, in accordance with some embodiments.

As shown in FIG. 1K, an underfill layer 410 is filled between the substrate 330 and the buffer layer 130, in accordance with some embodiments. The underfill layer 410 is in direct contact with the buffer layer 130 and the substrate 330, in accordance with some embodiments. The underfill layer 410 surrounds the conductive bumps 360, in accordance with some embodiments. The underfill layer 410 includes an insulating material such as a polymer material, in accordance with some embodiments. The polymer material includes, for example, epoxy resins (e.g., bisphenol A resins, bisphenol F resins, cycloaliphatic epoxy resins, and mixtures thereof), cyanate esters, siloxiranes, maleimides, polybenzoxazines, and/or polyimides.

Figure 1L:
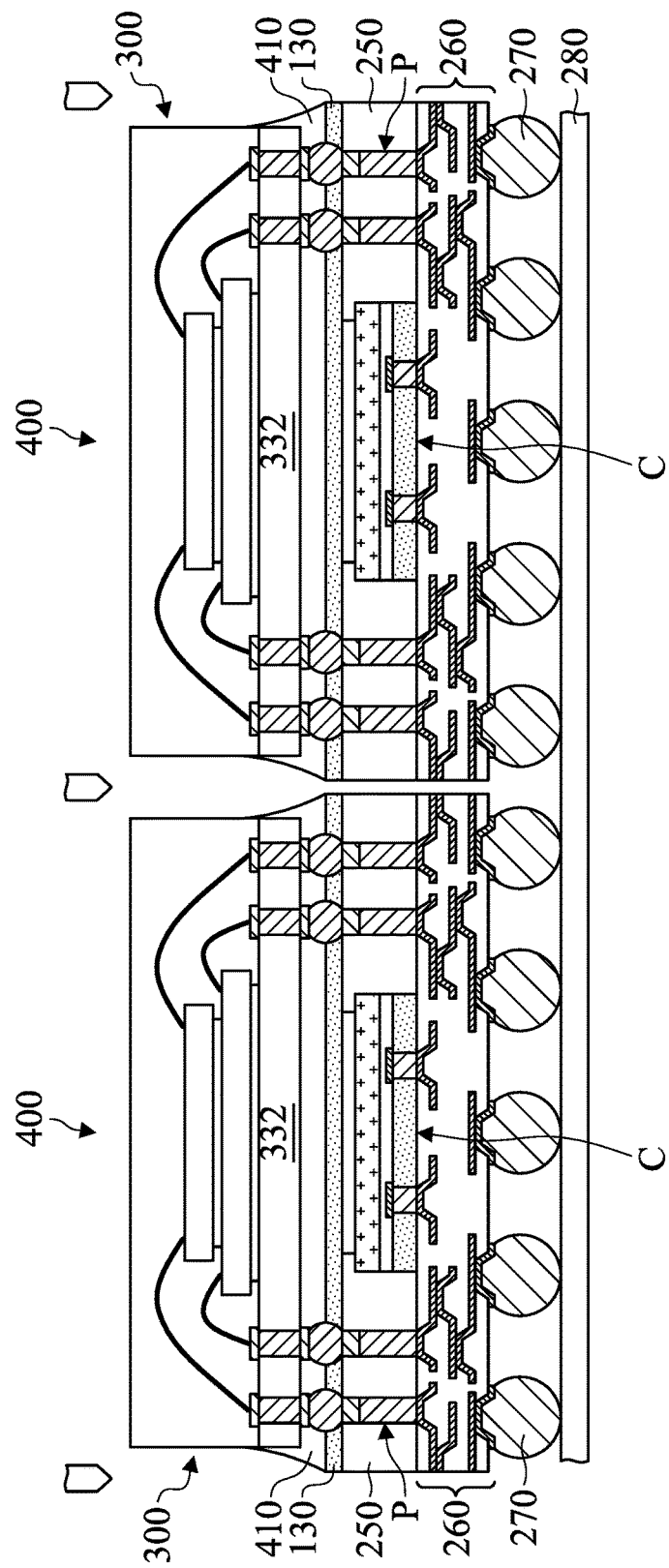

As shown in FIG. 1L, a mechanical singulation process is performed over the underfill layer 410 and the buffer layer 130 between the chip packages 300, the molding compound layer 250 between the chip structures C, and the redistribution structure 260, in accordance with some embodiments.

Figure 1M:
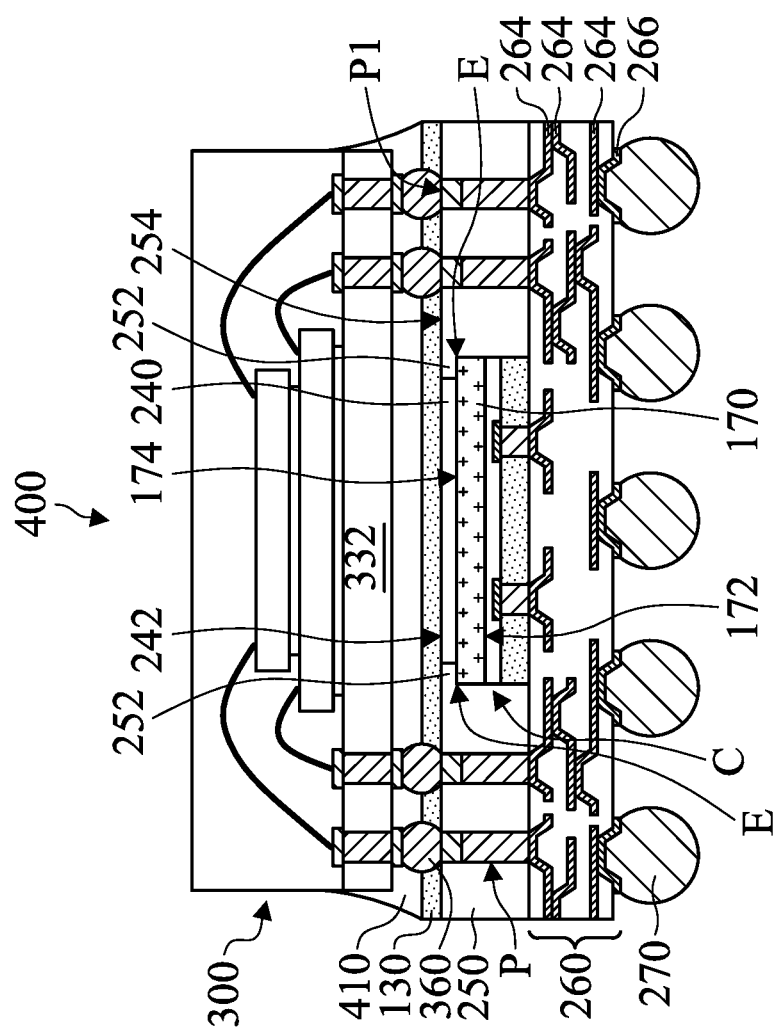

The mechanical singulation process cuts through the underfill layer 410, the buffer layer 130 (if existed), the molding compound layer 250, and the redistribution structure 260 so as to form individual chip package structures 400, in accordance with some embodiments. As shown in FIG. 1M, the frame 280 (or the carrier) is subsequently removed, in accordance with some embodiments.

Each of the chip package structures 400 includes the chip package 300, the chip structure C, the molding compound layer 250, the redistribution structure 260, the conductive bumps 270, and the conductive pillars P, in accordance with some embodiments. The redistribution structure 260 is also referred to as a substrate, in accordance with some embodiments.

The chip 170 is over the redistribution structure 260, in accordance with some embodiments. The front surface 172 faces the redistribution structure 260, in accordance with some embodiments. The adhesive layer 240 is on the back surface 174, in accordance with some embodiments. The adhesive layer 240 partially covers the back surface 174, in accordance with some embodiments.

The molding compound layer 250 is over the redistribution structure 260, in accordance with some embodiments. The molding compound layer 250 surrounds the chip 170, the adhesive layer 240, and the conductive pillars P, in accordance with some embodiments. The buffer layer 130 is on the adhesive layer 240 and the molding compound layer 250, in accordance with some embodiments.

In some embodiments, a portion 252 of the molding compound layer 250 extends onto the back surface 174, in accordance with some embodiments. The portion 252 of the molding compound layer 250 is between the chip 170 and the buffer layer 130, in accordance with some embodiments. The portion 252 of the molding compound layer 250 is in direct contact with the back surface 174, the adhesive layer 240, and the buffer layer 130. The portion 252 of the molding compound layer 250 continuously surrounds the entire adhesive layer 240, in accordance with some embodiments.

In some embodiments, a top surface 242 of the adhesive layer 240 is substantially coplanar with a top surface 254 of the molding compound layer 250. The conductive pillars P pass through the molding compound layer 250 to electrically connect the conductive bumps 360 to the wiring layers 264 and the pads 266 of the redistribution structure 260, in accordance with some embodiments. In some embodiments, a top surface P1 of the conductive pillar P is substantially coplanar with the top surface 242 of the adhesive layer 240 and the top surface 254 of the molding compound layer 250.

As shown in FIG. 1M, since the adhesive layer 240 does not cover the edge E of the chip 170, the formation of bubbles in the adhesive layer 240 may be prevented or reduced. Therefore, the yield of the chip package structure 400 can be improved.

Figure 2:
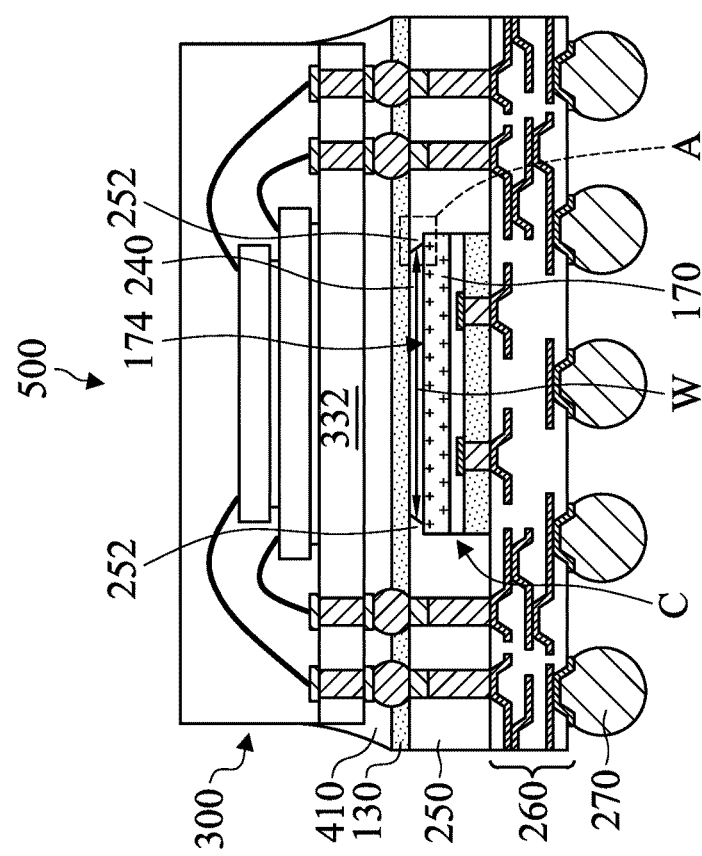
FIG. 2 is a cross-sectional view illustrating a semiconductor device structure, in accordance with some embodiments.

FIG. 2 is a cross-sectional view illustrating a semiconductor device structure, in accordance with some embodiments. As shown in FIG. 2, the chip package structure 500 is similar to the chip package structure 400 of FIG. 1M, except that the adhesive layer 240 of the chip package structure 500 has a width W, which increases from the buffer layer 130 to the chip 170, in accordance with some embodiments. In some embodiments, the width W of the adhesive layer 240 continuously increases toward the chip 170.

Figure 2A:
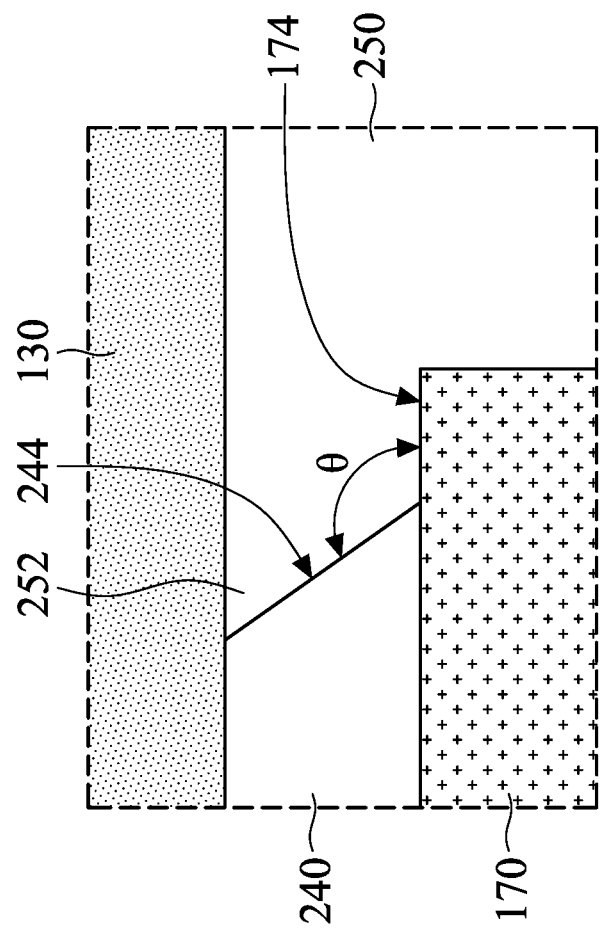
FIG. 2A is an enlarged view of region A of FIG. 2, in accordance with some embodiments.

FIG. 2A is an enlarged view of region A of FIG. 2, in accordance with some embodiments. As shown in FIGS. 2 and 2A, the adhesive layer 240 has a sidewall 244, in accordance with some embodiments. In some embodiments, an angle θ between the sidewall 244 of the adhesive layer 240 and the back surface 174 of the chip 170 is greater than about 90° and less than about 180°. The angle θ ranges from about 100° to about 160°, in accordance with some embodiments.

As shown in FIG. 2, a portion 252 of the molding compound layer 250 is between the back surface 174 of the chip 170 and the buffer layer 130, in accordance with some embodiments. The portion 252 of the molding compound layer 250 is also between the adhesive layer 240 and the buffer layer 130, in accordance with some embodiments.

Figure 3:
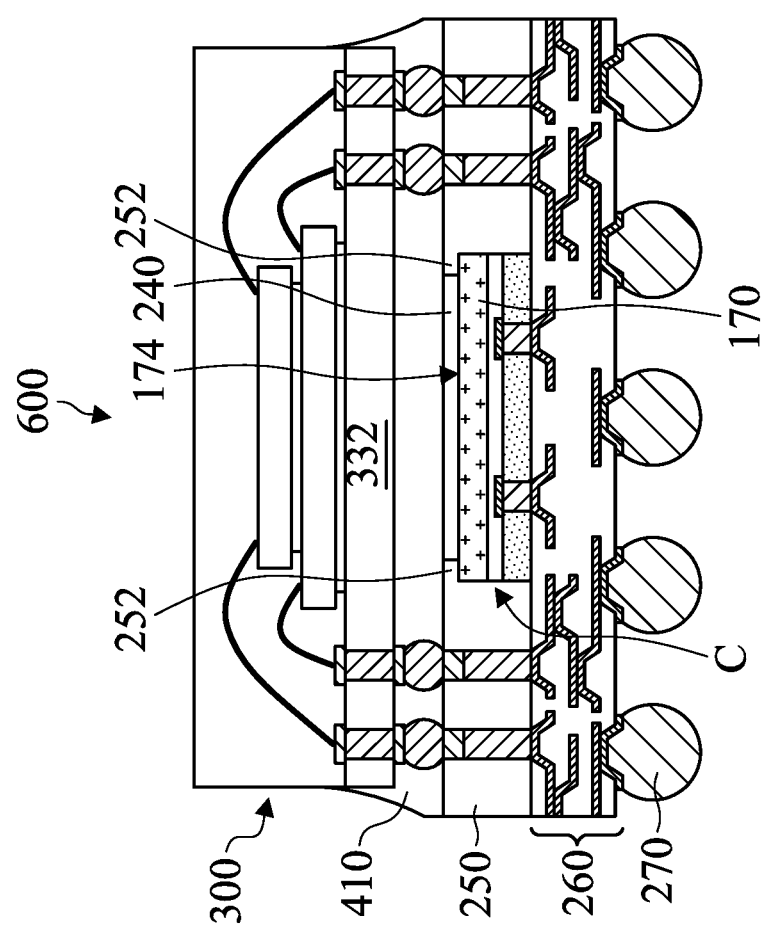
FIG. 3 is a cross-sectional view illustrating a semiconductor device structure, in accordance with some embodiments.

FIG. 3 is a cross-sectional view illustrating a semiconductor device structure, in accordance with some embodiments. As shown in FIG. 3, the chip package structure 600 is similar to the chip package structure 400 of FIG. 1M, except that the chip package structure 600 does not include the buffer layer 130, in accordance with some embodiments.

In the chip package structure 600, a portion 252 of the molding compound layer 250 extends onto the back surface 174, in accordance with some embodiments. The portion 252 of the molding compound layer 250 is between the back surface 174 of the chip 170 and the underfill layer 410, in accordance with some embodiments.

The portion 252 of the molding compound layer 250 is in direct contact with the back surface 174, the adhesive layer 240, and the underfill layer 410. The portion 252 of the molding compound layer 250 continuously surrounds the entire adhesive layer 240, in accordance with some embodiments. The underfill layer 410 is in direct contact with the adhesive layer 240 and the molding compound layer 250, in accordance with some embodiments.

Figure 4:
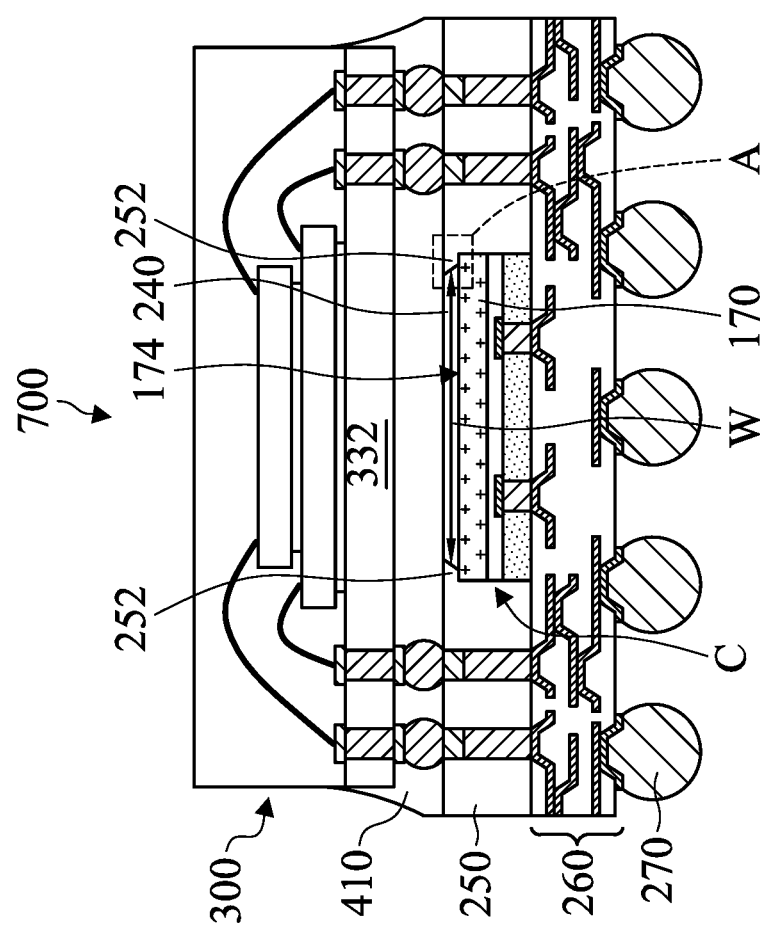
FIG. 4 is a cross-sectional view illustrating a semiconductor device structure, in accordance with some embodiments.

FIG. 4 is a cross-sectional view illustrating a semiconductor device structure, in accordance with some embodiments. As shown in FIG. 4, the chip package structure 700 is similar to the chip package structure 600 of FIG. 3, except that the adhesive layer 240 of the chip package structure 700 has a width W, which increases from the underfill layer 410 to the chip 170, in accordance with some embodiments. In some embodiments, the width W continuously increases toward the chip 170.

Figure 4A:
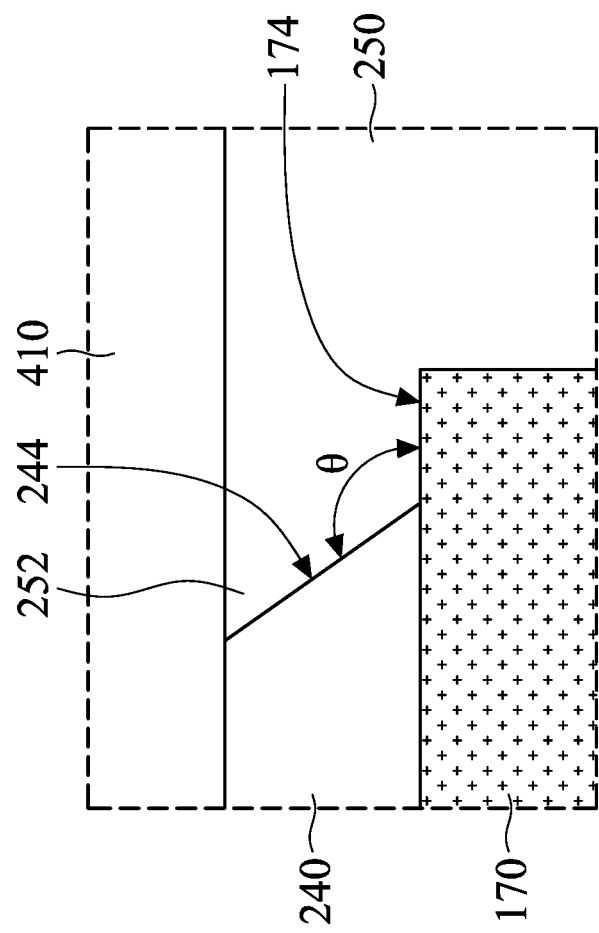
FIG. 4A is an enlarged view of region A of FIG. 4, in accordance with some embodiments.

FIG. 4A is an enlarged view of region A of FIG. 4, in accordance with some embodiments. As shown in FIGS. 4 and 4A, the adhesive layer 240 has a sidewall 244, in accordance with some embodiments. In some embodiments, an angle θ between the sidewall 244 of the adhesive layer 240 and the back surface 174 of the chip 170 is greater than about 90° and less than about 180°. The angle θ ranges from about 100° to about 160°, in accordance with some embodiments.

As shown in FIG. 4, a portion 252 of the molding compound layer 250 is between the back surface 174 of the chip 170 and the underfill layer 410, in accordance with some embodiments. The portion 252 of the molding compound layer 250 is also between the adhesive layer 240 and the underfill layer 410, in accordance with some embodiments.

In accordance with some embodiments, chip package structures are provided. The chip package structures have an adhesive layer formed on a chip, and the adhesive layer does not cover the edges of the chip. Therefore, the formation of bubbles, which tend to be formed in an adhesive layer close to or covering edges of a chip, is prevented or reduced. As a result, the yield of the chip package structures is improved.

In accordance with some embodiments, a chip package structure is provided. The chip package structure includes a redistribution structure. The chip package structure includes a first chip over the redistribution structure. The first chip has a front surface and a back surface opposite to the front surface, and the front surface faces the redistribution structure. The chip package structure includes an adhesive layer on the back surface. The adhesive layer is in direct contact with the back surface, and a first maximum length of the adhesive layer is less than a second maximum length of the first chip. The chip package structure includes a molding compound layer over the redistribution structure and surrounding the first chip and the adhesive layer. A first top surface of the adhesive layer is substantially coplanar with a second top surface of the molding compound layer.

In accordance with some embodiments, a chip package structure is provided. The chip package structure includes a first substrate. The chip package structure includes a first chip over the first substrate. The first chip has a front surface and a back surface opposite to the front surface. The front surface faces the first substrate, and the back surface has a central region and a peripheral region continuously surrounding the entire central region. The chip package structure includes an adhesive layer covering the central region and not covering the peripheral region. The adhesive layer is in direct contact with the back surface. The adhesive layer is made of an insulating material. The chip package structure includes a molding compound layer over the first substrate and surrounding the first chip and the adhesive layer. A first top surface of the adhesive layer is substantially coplanar with a second top surface of the molding compound layer.

In accordance with some embodiments, a chip package structure is provided. The chip package structure includes a redistribution structure. The chip package structure includes a first chip over the redistribution structure. The first chip has a front surface and a back surface opposite to the front surface. The front surface faces the redistribution structure. The chip package structure includes an adhesive layer partially covering the back surface. The chip package structure includes a molding compound layer over the redistribution structure and surrounding the first chip and the adhesive layer. A portion of the molding compound layer extends onto the back surface. A first top surface of the adhesive layer is substantially coplanar with a second top surface of the molding compound layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   a redistribution structure;
   a first chip over the redistribution structure, wherein the first chip has a front surface and a back surface opposite to the front surface, and the front surface faces the redistribution structure;
   an adhesive layer on the back surface, wherein the adhesive layer is in direct contact with the back surface, and a first maximum length of the adhesive layer is less than a second maximum length of the first chip; and
   a molding compound layer over the redistribution structure and surrounding the first chip and the adhesive layer, wherein a first top surface of the adhesive layer is substantially coplanar with a second top surface of the molding compound layer.

2. The chip package structure as claimed in claim 1, further comprising:
   a buffer layer on the adhesive layer and the molding compound layer.

3. The chip package structure as claimed in claim 2, further comprising:
   a substrate over the buffer layer;
   a second chip over the substrate;
   a plurality of conductive bumps disposed between the substrate and the molding compound layer and passing through the buffer layer; and
   an underfill layer disposed between the substrate and the buffer layer and surrounding the conductive bumps, wherein the underfill layer is in direct contact with the buffer layer.

4. The chip package structure as claimed in claim 2, wherein a portion of the molding compound layer is between the back surface of the first chip and the buffer layer and surrounds the adhesive layer.

5. The chip package structure as claimed in claim 1, wherein an angle between a sidewall of the adhesive layer and the back surface of the first chip ranges from about 100° to about 160°.

6. The chip package structure as claimed in claim 1, further comprising:
   a substrate over the first chip;
   a second chip over the substrate;
   a plurality of conductive bumps between the substrate and the molding compound layer; and
   an underfill layer between the substrate and the adhesive layer and between the substrate and the molding compound layer and surrounding the conductive bumps, wherein the underfill layer is in direct contact with the adhesive layer and the molding compound layer.

7. The chip package structure as claimed in claim 6, wherein a portion of the molding compound layer is between the back surface of the first chip and the underfill layer.

8. The chip package structure as claimed in claim 7, wherein the portion of the molding compound layer is in direct contact with the back surface of the first chip, the underfill layer, and the adhesive layer.

9. The chip package structure as claimed in claim 6, wherein a portion of the molding compound layer is between the adhesive layer and the underfill layer.

10. A chip package structure, comprising:
    a first substrate;
    a first chip over the first substrate, wherein the first chip has a front surface and a back surface opposite to the front surface, the front surface faces the first substrate, and the back surface has a central region and a peripheral region continuously surrounding the entire central region;

an adhesive layer covering the central region and not covering the peripheral region, wherein the adhesive layer is in direct contact with the back surface, and the adhesive layer is made of an insulating material; and a molding compound layer over the first substrate and surrounding the first chip and the adhesive layer, wherein a first top surface of the adhesive layer is substantially coplanar with a second top surface of the molding compound layer.

11. The chip package structure as claimed in claim 10, wherein the molding compound layer is in direct contact with the adhesive layer and the back surface of the first chip.

12. The chip package structure as claimed in claim 10, wherein a width of the adhesive layer increases toward the first chip.

13. The chip package structure as claimed in claim 10, further comprising:
a buffer layer over and in direct contact with the adhesive layer and the molding compound layer;
a second substrate over the buffer layer;
a second chip over the second substrate;
a plurality of conductive bumps between the second substrate and the molding compound layer and passing through the buffer layer; and
an underfill layer between the second substrate and the buffer layer and surrounding the conductive bumps, wherein the underfill layer is in direct contact with the buffer layer.

14. The chip package structure as claimed in claim 10, further comprising:
a second substrate over the first chip;
a second chip over the second substrate;
a plurality of conductive bumps between the second substrate and the molding compound layer; and
an underfill layer between the second substrate and the adhesive layer and between the second substrate and the molding compound layer and surrounding the conductive bumps, wherein the underfill layer is in direct contact with the adhesive layer and the molding compound layer.

15. The chip package structure as claimed in claim 10, wherein the adhesive layer is made of a polymer material.

16. The chip package structure as claimed in claim 10, further comprising:
a second substrate over the first chip;
a second chip over the second substrate;
a third chip over the second chip;
a plurality of conductive pillars passing through the molding compound layer; and
a plurality of conductive bumps between the second substrate and the conductive pillars,
wherein the second chip and the third chip are electrically connected to the first substrate through the second substrate, the conductive bumps, and the conductive pillars.

17. A chip package structure, comprising:
a redistribution structure;
a first chip over the redistribution structure, wherein the first chip has a front surface and a back surface opposite to the front surface, and the front surface faces the redistribution structure;
an adhesive layer partially covering the back surface; and
a molding compound layer over the redistribution structure and surrounding the first chip and the adhesive layer, wherein a portion of the molding compound layer extends onto the back surface, and a first top surface of the adhesive layer is substantially coplanar with a second top surface of the molding compound layer.

18. The chip package structure as claimed in claim 17, further comprising:
a conductive pillar passing through the molding compound layer and electrically connected to the redistribution structure, wherein the conductive pillar has a third top surface substantially coplanar with the first top surface and the second top surface.

19. The chip package structure as claimed in claim 17, further comprising:
a buffer layer on the adhesive layer and the molding compound layer, wherein the portion of the molding compound layer is between the buffer layer and the first chip;
a substrate over the buffer layer;
a second chip over the substrate;
a plurality of conductive bumps between the substrate and the molding compound layer and passing through the buffer layer; and
an underfill layer between the substrate and the buffer layer and surrounding the conductive bumps, wherein the underfill layer is in direct contact with the buffer layer.

20. The chip package structure as claimed in claim 17, further comprising:
a substrate over the first chip and the molding compound layer;
a second chip over the substrate;
a plurality of conductive bumps between the substrate and the molding compound layer; and
an underfill layer between the substrate and the adhesive layer and between the substrate and the molding compound layer and surrounding the conductive bumps, wherein the underfill layer is in direct contact with the adhesive layer and the molding compound layer, and the portion of the molding compound layer is between the underfill layer and the first chip.

* * * * *